United States Patent
Dieter et al.

(10) Patent No.: US 8,823,449 B2
(45) Date of Patent: Sep. 2, 2014

(54) EXTREMELY HIGH FREQUENCY DUAL-MODE CLASS AB POWER AMPLIFIER

(75) Inventors: Joos Dieter, Mechelen (BE); Wim Philibert, Mortsel (BE); Patrick Reynaert, Vertrijk (BE); Dixian Zhao, Leuven (BE)

(73) Assignee: ST-Ericsson SA, Plan-les-Ouates (CH)

( * ) Notice: Subject to any disclaimer, the term of this patent is extended or adjusted under 35 U.S.C. 154(b) by 20 days.

(21) Appl. No.: 13/591,061

(22) Filed: Aug. 21, 2012

(65) Prior Publication Data

US 2013/0265108 A1 Oct. 10, 2013

Related U.S. Application Data

(60) Provisional application No. 61/625,168, filed on Apr. 17, 2012, provisional application No. 61/620,732, filed on Apr. 5, 2012.

(51) Int. Cl.
*H03F 1/14* (2006.01)
(52) U.S. Cl.
USPC .............................................. 330/51; 330/195
(58) Field of Classification Search
USPC ................................... 330/51, 165, 195, 276
See application file for complete search history.

(56) References Cited

U.S. PATENT DOCUMENTS

| | | | |
|---|---|---|---|
| 7,973,603 B2 * | 7/2011 | Kammula et al. | 330/284 |
| 8,319,562 B2 * | 11/2012 | Sun et al. | 330/311 |
| 2010/0328542 A1 * | 12/2010 | Kammula et al. | 348/725 |

OTHER PUBLICATIONS

Chowdhury et al. "A Fully Integrated Dual-Mode Highly Linear 2.4 GHz CMOS Power Amplifier for 4G WiMax Applications." IEEE Journal of Solid-State Circuits, Dec. 2009, pp. 3393-3402, vol. 44, No. 12, IEEE Service Center, Piscataway, NJ.
Kluge et al. "A Fully Integrated 2.4-GHz IEEE 802.15.4-Compliant Transceiver for ZigBee Applications." IEEE Journal of Solid-State Circuits, Dec. 2006, pp. 2767-2775, vol. 41, No. 12, IEEE Service Center, Piscataway, NJ.
Law, C. et al. "A High-Gain 60GHz Power Amplifier with 20dBm Output Power in 90nm CMOS." 2010 IEEE International Solid-State Circuits Conference, ISSCC Dig. Tech. Papers, session 23, Feb. 2010, pp. 426-427.
Chen, J. et al. "A Compact 1V 18.6dBm 60GHz Power Amplifier in 65nm CMOS." 2011 IEEE International Solid-State Circuits Conference, ISSCC Dig. Tech. Papers, session 24, Feb. 2011, pp. 432-433.
Koo, B. et al. "A Fully Integrated Dual-Mode CMOS Power Amplifier for WCDMA Applications." 2012 IEEE International Solid-State Circuits Conference, ISSCC Dig. Tech. Papers, session 4, Feb. 2012, pp. 82-83.

(Continued)

*Primary Examiner* — Khanh V Nguyen
(74) *Attorney, Agent, or Firm* — Coats & Bennett, P.L.L.C.

(57) ABSTRACT

An Extremely High Frequency (EHF) dual-mode PA with a power combiner is designed using 40-nm bulk CMOS technology. One of the unit PAs can be switched off for the low power applications. In the design, circuit level optimization and trade-off are performed to ensure the good performance in both modes. The PA achieves a $P_{SAT}$ of 17.4 dBm with 29.3% PAE in high power mode and a $P_{SAT}$ of 12.6 dBm with 19.6% PAE in low power mode. The reliability measurements are also conducted and a lifetime of 80613 hours is estimated based on a commonly used empirical model. The excellent performance (e.g., highest reported PAE) achieved in this design further confirms the scaling of CMOS technology will continue to benefit the mm-wave transceiver design.

12 Claims, 3 Drawing Sheets

(56) References Cited

OTHER PUBLICATIONS

Chowdhury, D. et al. "A Fully Integrated Dual-Mode Highly Linear 2.4 GHz CMOS Power Amplifier for 4G WiMax Applications." IEEE Journal of Solid-State Circuits, vol. 44, No. 12, Dec. 2009, pp. 3393-3402.

Abbasi, M. et al. "A Broadband Differential Cascode Power Amplifier in 45 nm CMOS for High-Speed 60 GHz System-on-Chip." 2010 IEEE Radio Frequency Integrated Circuits Symposium, May 2010, pp. 533-536.

Stephens, D. et al. "RF Reliability of Short Channel NMOS Devices." 2009 IEEE Radio Frequency Integrated Circuits Symposium, May 2009, pp. 343-346.

Kjellberg, T. et al. "A Compact Cascode Power Amplifier in 45-nm CMOS for 60-GHz Wireless Systems." CISC Symposium, Nov. 2009.

Zhao, D. et al. "A 60GHz Outphasing Transmitter in 40nm CMOS with 15.6dBm Output Power." 2012 IEEE International Solid-State Circuits Conference, Feb. 2012, pp. 170-171.

Aoki, I. et al. "Fully Integrated CMOS Power Amplifier Design Using the Distributed Active-Transformer Architecture." IEEE Journal of Solid-State Circuits, vol. 37, No. 3, Mar. 2002, pp. 371-383.

IEEE, "IEEE Standard for Information technology—Telecommunications and information exchange between systems—Local and metropolitan area networks—Specific requirements; Part 15.3: Wireless Medium Access Control (MAC) and Physical Layer (PHY) Specifications for High Rate Wireless Personal Area Networks (WPANs); Amendment 2: Milimeter-wave-based Alternative Physical Layer Extension." IEEE Std 802.15.3c; Oct. 12, 2009.

* cited by examiner

EXTREMELY HIGH FREQUENCY DUAL-MODE CLASS AB POWER AMPLIFIER

This application claims priority to U.S. Provisional Patent Application Ser. No. 61/620,732, Titled "60 GHz Dual-Mode Class AB Power Amplifier Implementation," filed Apr. 5, 2012, and also to U.S. Provisional Patent Application Ser. No. 61/625,168, Titled "Extremely High Frequency Dual-Mode Class AB Power Amplifier," filed Apr. 17, 2012, the disclosure of both of which are incorporated herein by reference in their entireties.

FIELD OF INVENTION

The present invention relates generally to amplifier circuits, and in particular to a dual-mode, extremely high frequency power amplifier featuring high efficiency in both high-power and low-power modes, owing to a re-configurable output power combiner.

BACKGROUND

Radios operating in the extremely high frequency (EHF) band of the electromagnetic (EM) spectrum exhibit numerous advantages, and are anticipated to play a significant role in communication technology—particularly wireless, mobile communication devices. For example, radios operating in EHF exhibit numerous advantages over radios operating in other frequency bands of the spectrum, including license-free spectrum, relatively narrow beam antennas, and inherent security due to oxygen absorption and the narrow beam width.

As used herein, the extremely high frequency (EHF) band of the EM spectrum includes frequencies from approximately 30 to 300 GHz. This is the highest frequency range of what is considered to be Radio Frequency (RF) EM radiation. Above this frequency band, EM radiation is considered to be in the low infrared light spectrum (also referred to as terahertz radiation). EM energy in the EHF band has a wavelength in the range of approximately 10 mm to 1 mm. Hence, EHF EM radiation is also generally referred to as millimeter wave RF (mm-wave). Accordingly, the terms EHF and mm-wave are used synonymously herein when referring to a frequency band.

In the U.S., the Federal Communication Commission (FCC) has allocated an unprecedented 7 GHz of un-channelized spectrum for license-free operation between 57-64 GHz. In contrast, less than 0.5 GHz of spectrum is allocated between 2-6 GHz for WiFi and other license-free applications. The portion of the EHF band near 60 GHz thus represents a significant opportunity to implement multi-gigabit RF communication links. Standardization efforts in this area include WiGig and WirelessHD.

EHF radios utilize very narrow RF beams, enabling multiple EHF radio base stations or other transceivers to be installed on the same tower, rooftop, or the like, even if they are all operating at the same transmit and receive frequencies. Co-located radios operating in the same transmit and receive frequency ranges can easily be isolated from one another based on small lateral or angular antenna separations, and/or the use of cross-polarized antennas. While the RF beams are relatively narrow, however, they are sufficiently wide, e.g., compared to optical signals, such that fixed antennas may be accurately aligned by a non-expert installer with the use of a simple visual alignment tool, and communications are unaffected by minor antenna movement such as tower or building sway due to wind.

Oxygen attenuates RF signals near 60 GHz (e.g., ~57-64 GHz) due to a resonance of the oxygen molecule, a property that is unique to the near-60 GHz portion of the EM spectrum. While this property limits the distances that radio links at this frequency can cover, it also makes these links highly immune to interference from other radios at the same or near frequencies. For example, oxygen absorption ensures that a near-60 GHz signal will not extend far beyond its intended target.

The combination of narrow beam width and oxygen attenuation provides an inherent degree of security to near-60 GHz link communications. Due to the narrow beam width, an interceptor receiver must be placed directly in the main beam (and tuned to its carrier frequency) to receive a useful signal. In this position, it is likely to degrade the signal at the intended receiver sufficiently to allow for its detection. Due to oxygen attenuation, there is a limited distance beyond an intended receiver, along the main beam, at which a useful signal may be obtained by an interceptor receiver.

Accordingly, the demand is increasing for EHF capability in mobile communication devices, particularly near 60 GHz, to allow them to engage in communication channels supplemental to their primary channels (e.g., GSM, CDMA, LTE, and similar systems). However, high frequency electronics consume significant amounts of power, and hence are a major factor in depleting useful battery life. In particular, the millimeter-wave power amplifier (PA) is the most power-hungry block in an EHF transceiver. A typical requirement of an EHF PA is to deliver at least 10 dBm output power to set up a communication range of 1 m.

A conventional approach to satisfying both the high output power demands of EHF radios and minimizing power consumption (and hence battery depletion) when not transmitting, is a dual-mode PA in which two or more unit PAs are coupled together to achieve high output power. When not transmitting, one or more of the PA units may be disabled to reduce power consumption. The output signals of the units are typically combined with a transformer-based combiner. Such a combiner achieves an insertion loss of as little as 1.2 dB. However, the combiner loss can be as high as 5 dB in low-power mode, due to the extra loss introduced by the parasitic loading of the unit PA(s) in an off state.

The Background section of this document is provided to place embodiments of the present invention in technological and operational context, to assist those of skill in the art in understanding their scope and utility. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or delineate the scope of the invention. The sole purpose of this summary is to present some concepts disclosed herein in a simplified form as a prelude to the more detailed description that is presented later.

According to one or more embodiments described and claimed herein, the insertion loss of a coupling transformer in low-power mode of an extremely high frequency (EHF) power amplifier (PA) is reduced by inserting a switch at the primary side of the transformer for the unit(s) to be turned off. The switch is biased to eliminate reliability problems. For example, the PA may be switched to low-power mode when short-range communication (e.g., within about 1 m) is requested. In the low-power mode, power consumption is reduced by approximately 50% compared to high-power mode, thus affording significant savings of battery power for mobile radio devices.

One embodiment relates to a dual-mode PA operative to amplify signals having frequencies in the EHF band. The PA includes a plurality of separately-enabled, differential PA units arranged in parallel. Each PA unit includes an input stage comprising a pair of transistors arranged in a common-gate configuration; and a plurality of serially-connected output stages, each comprising a pair of transistors arranged in a common-source configuration. The PA also includes a transformer-based coupling circuit combining the outputs of the PA units. One or more PA units further includes a switch operative to short the PA unit outputs at the interface to the transformer-based coupling circuit in a low power mode, and to allow the PA unit outputs to couple to the transformer-based coupling circuit in a high power mode.

Another embodiment relates to a method of operating a dual-mode PA operative to amplify RF signals in the EHF band. The PA comprises a plurality of separately-enabled, differential PA units arranged in parallel, wherein each PA unit comprises an input stage comprising a pair of transistors arranged in a common-gate configuration and a plurality of serially-connected output stages, each comprising a pair of transistors arranged in a common-source configuration. A transformer-based coupling circuit combines the outputs of the PA units. According to the method, in a high power mode, two or more of the plurality of differential PA units are enabled by allowing the outputs of each PA unit to couple to the transformer-based coupling circuit. In a low power mode, at least one of the plurality of differential PA units is disabled by shorting the outputs of the disabled PA unit at the interface to the transformer-based coupling circuit.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

It should be understood at the outset that although illustrative implementations of one or more embodiments of the present disclosure are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Figure 1:
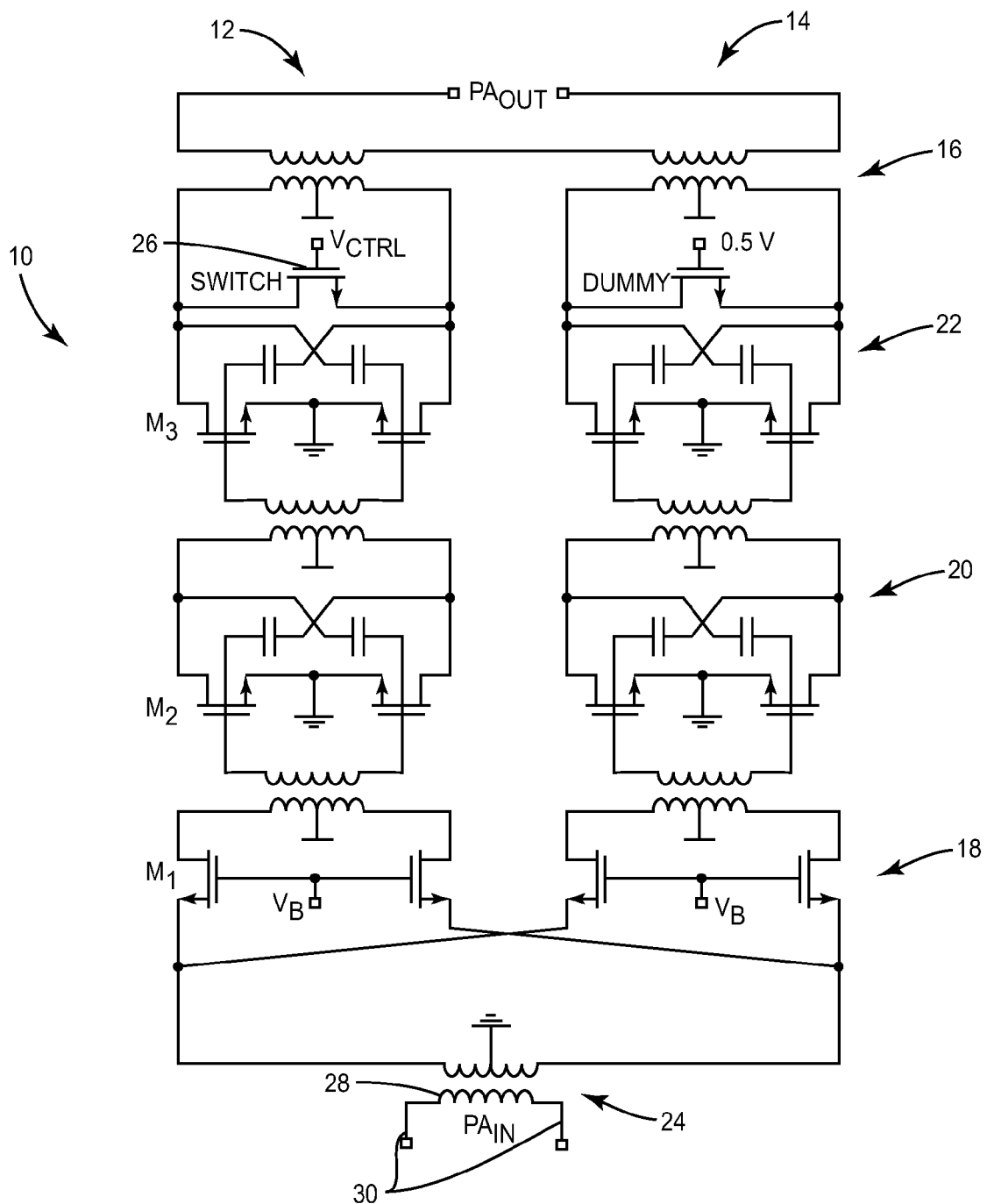
FIG. 1 is a schematic diagram of a power amplifier according to one embodiment.

An effective dual-mode PA—operative in a high-power mode and a low-power mode—at mm-wave frequencies, with low insertion loss in low-power mode, has not been achieved in the prior art, due to implementation challenges in both the combiner design and the layout floor plan. FIG. 1 depicts a schematic diagram of an EHF dual-mode Class AB power amplifier (PA) 10 according to one embodiment of the present invention. The design incorporates two unit PAs 12, 14 with a transformer-based power combiner 16 at the output. Each PA 12, 14 is a three-stage differential amplifier, wherein the transistor sizes of the three gain stages 18, 20, 22 are scaled by a factor of two. The last two amplifier stages 20, 22 are configured as common-source (CS) amplifiers, for superior power gain at mm-wave frequencies (i.e., 2 dB higher in maximum power gain at 60 GHz compared with common-gate configuration). The common-gate (CG) stage functions as the input stage 18, partially because its low input impedance simplifies the design of the input matching network 24.

The neutralization technique is adopted by cross-connecting the interdigitated metal-oxide-metal (MOM) capacitors between the drain and gate terminals to improve the stability and reverse isolation at mm-wave frequencies. Advanced CMOS technology provides sufficient power gain (i.e., 10 dB) for a single amplifier stage for the PA 10 to be biased in Class AB mode to ensure high efficiency. In low-power mode, the gate bias of one unit PA 12 is switched off to reduce power consumption.

The transformer-based combiner 16 is employed for power combining and ensures a compact layout. It is implemented in an overlay structure with the top two metal layers. Both metal layers have a thickness of only 0.9 μm, and the combiner 16 achieves an insertion loss of 1.2 dB. However, the combiner loss could be as high as 5 dB in low-power mode due to the detuning and the extra loss introduced by the parasitic loading of the unit PA 12 in off state.

Figure 2:
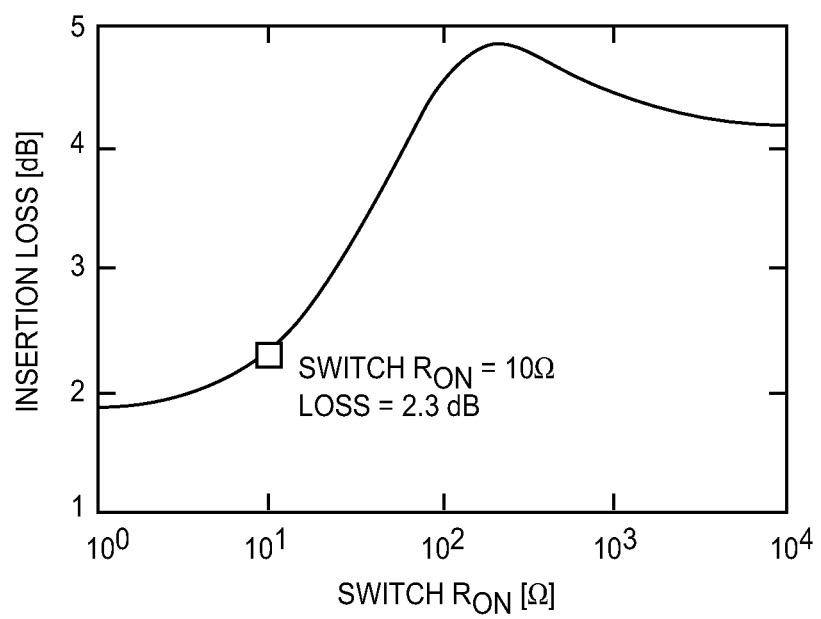
FIG. 2 is a graph of the insertion loss of the combiner in the circuit of FIG. 1 as a function of the on-resistance ($R_{ON}$) of the switch.

According to embodiments of the present invention, this loss is alleviated by shorting the output stage 22 of the off-state amplifier unit 12 with a MOS transistor switch 26. FIG. 2 depicts the insertion loss of the combiner 16 as a function of the on-resistance ($R_{ON}$) of the switch 26. In one embodiment, an $R_{ON}$ of 10Ω is used, which reduces the insertion loss to 2.3 dB.

To minimize the parasitic capacitance introduced by the switch 26, a thin-oxide transistor with gate length of 40 nm is used. To ensure reliable operations, the gate of the switch transistor 26 is biased at 0.5 V in the "on" state and 2 V in "off" state. The maximum voltage across the gate oxide of the switch 26 in both states is approximately 1V, which leaves sufficient margin to avoid gate oxide breakdown.

To ensure proper operation of the dual-mode PA 10, the design of the first amplifier stage 18 and the input matching network 24 is also important. A common-gate amplifier configuration is used for the input stage 18, which has ten times lower input impedance compared with a common-source configuration at ~60 GHz. Note that the insertion loss of the input matching network 24 is limited by the passives' Q-factor and its load impedance. By employing an input stage 18 with low input impedance, the PA 10 can draw nearly the same amount of signal current from the input matching network 24 (i.e., the matching network 24 has similar insertion loss) in both modes. In addition, to compensate the 1 dB difference in the insertion loss of the power combiner 16 between different modes, the input matching network 24 (i.e., a transformer 28 and differential transmission lines 30) is optimized for the low-power mode so that the PA 10 can provide similar power gain in both modes.

Table 1 depicts several technical characteristics of one embodiment of the present invention, as compared to several prior art EHF dual-mode power amplifiers.

TABLE 1

Comparison of Technical Specifications

|  | This Work (High/Low) | [3] | [4] | [6] |
|---|---|---|---|---|
| Tech. [nm] | 40 | 65 | 65 | 45 |
| $V_{DD}$ [V] | 1 | 1.2 | 1 | 2 |
| $P_{SAT}$ [dBm] | 17.4/12.6 | 19.9 | 18.6 | 14.5 |
| $P_{1dB}$ [dBm] | 14.0/9.5 | 18.2 | 15.0 | 11.2 |
| $PAE_{MAX}$ [%] | 29.3/19.6 | 14.2 | 15.1 | 14.4 |
| $P_{DC}$ [mW] | 153/80 | 640 | 480 | 180 |
| Area [mm$^2$] | 0.074 | 1.4* | 0.12* | 0.04 |

*Estimated from the chip micrograph.

wherein
Tech=CMOS Technology;
$V_{DD}$=Drain voltage;
$P_{SAT}$=Saturation Power—the power for which output power is not increased with further increase in input power;
$P_{1dB}$=1 dB compression point;
$PAE_{MAX}$=Maximum Power Added Efficiency;
$P_{DC}$=DC power consumption; and
Area=silicon die area.

The prior art designs compared against in Table 1 are included in the following list, the disclosures of which are all incorporated herein by reference in their entireties:

[1] IEEE 802.15 Working Group: Wireless PAN Task Group 3c. Millimeter wave alternative PHY, 2009. Online available: http://www.ieee802.org/15/pub/TG3c.html.
[2] WiGig MAC and PHY specification, version 1.0, Wireless Gigabit Alliance.
[3] C. Y. Law and A. Pham, "A high-gain 60 GHz power amplifier with 20 dBm output power in 90 nm CMOS," ISSCC Dig. Tech. Papers, pp. 426-427, February 2010.
[4] J. Chen and A. M. Niknejad, "A compact 1V 18.6 dBm 60 GHz power amplifier in 65 nm CMOS," ISSCC Dig. Tech. Papers, pp. 432-433, February 2011.
[5] D. Chowdhury et al., "A fully integrated dual-mode highly linear 2.4 GHz CMOS power amplifier for 4G WiMax applications," IEEE J. Solid-State Circuits, vol. 44, no.12, pp.3393-3402, September 2009.
[6] M. Abbasi et al., "A broadband differential cascode power amplifier in 45 nm CMOS for high-speed 60 GHz system-on-chip," RFIC Symposium, pp. 533-536, May 2010.
[7] T. Kjellberg et al., "A compact cascode power amplifier in 45-nm CMOS for 60-GHz wireless system," CISC Symposium, November 2009.
[8] D. Stephens et al., "RF reliability of short channel NMOS devices," RFIC Symposium, pp. 343-346, May 2009
[9] B. Koo et al., "A fully integrated dual-mode CMOS power amplifier for WCDMA applications," ISSCC Dig. Tech. Papers, pp. 82-83, February 2012. The full disclosure of a draft of a paper to be published by Zhao, et al., "A 60 GHz Dual-Mode Class AB Power Amplifier with 29.3% PAE in 40-nm CMOS," authored by some of the present inventors and attached hereto as Appendix A, is incorporated herein in its entirety.

According to embodiments of the present invention, to reduce the power consumption and extend the battery lifetime, one unit PA 12 of a dual-mode EHF power amplifier 10 is turned off in low-power mode. A switch 26 is employed to short the output of this off-state unit PA 12 and thus improve the back-off efficiency. The PA 10 achieves a saturated output power ($P_{SAT}$) of 17.4 dBm with 29.3% PAE in high power mode and a $P_{SAT}$ of 12.6 dBm with 19.6% PAE in low-power mode.

Figure 3:
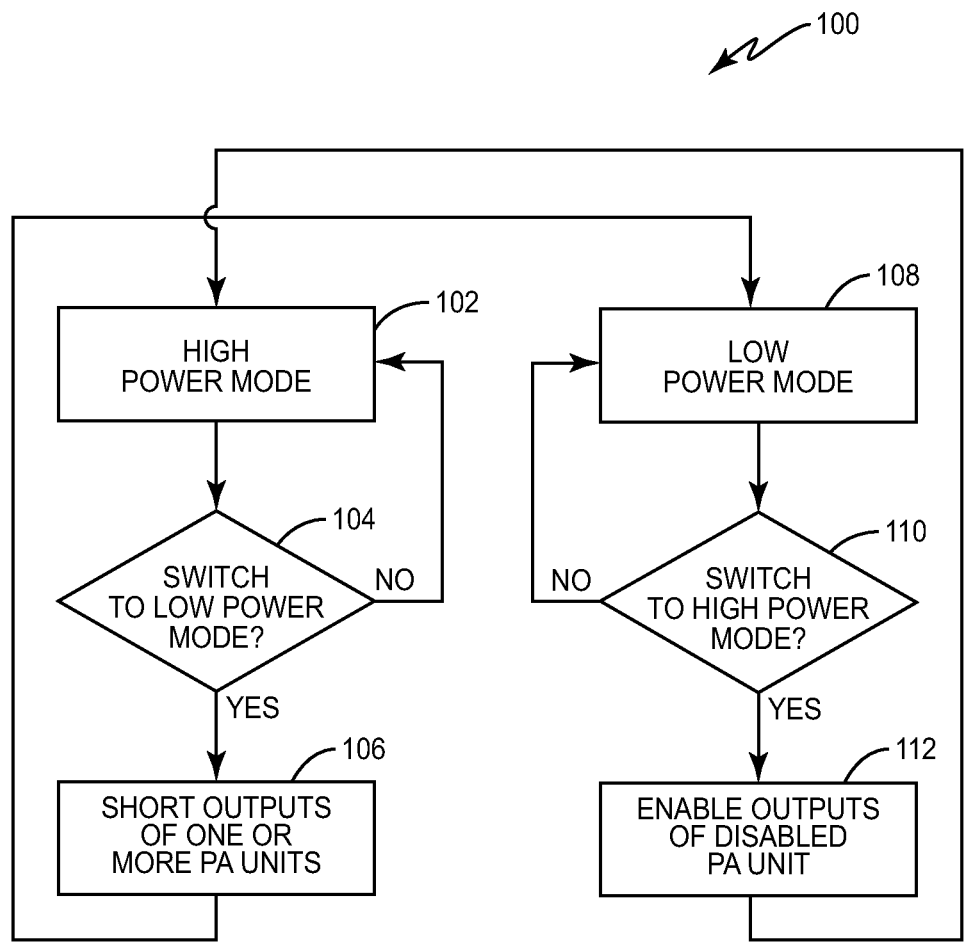
FIG. 3 is a flow diagram of a method of operating a dual-mode power amplifier.

FIG. 3 depicts a flow diagram of a method 100 of operating a dual-mode PA 10 operative to amplify RF signals in the EHF range. The PA 10 comprises a plurality of separately-enabled, differential PA units 12, 14 arranged in parallel, wherein each PA unit 12, 14 comprises an input stage 18 comprising a pair of transistors arranged in a common-gate configuration and a plurality of serially-connected output stages 20, 22, each comprising a pair of transistors arranged in a common-source configuration. A transformer-based coupling circuit 16 combines the outputs of the PA units 12, 14. According to the method 100, the PA 10 operates in one of a high power mode or a low power mode. If the PA 10 is in the high power mode (block 102), if a decision is made to switch operation to a low power mode (block 104), such as by a controller (now shown in the drawing figures), the outputs of one or more PA units 12, 14 are shorted to remove the PA unit 12, 14 from the transformer-based coupling circuit 16. The outputs may be shorted, for example, by biasing a switching transistor 26 to an "on" or conductive state. This removes the PA unit 12 from the output, resulting in efficient operation in a low power mode (block 108). Some time later, if a decision is made to switch operation to the high power mode (block 110), the outputs of the disabled PA unit(s) 12 are enabled (block 112) to couple the PA unit 12 to the transformer-based coupling circuit 16. The outputs may be enabled, for example, by biasing the switching transistor 26 to an "off" or non-conductive state. This couples the PA unit 12 to the output, resulting in operation in high power mode (block 102).

Embodiments of the present invention enable the commercialization of EHF band consumer electronics—particularly mobile devices—by providing low-power EHF radios and thus extending the battery lifetime of mobile devices. Although particular embodiments are described herein as operating at or near 60 GHz, the present invention is not limited to this frequency, but may be advantageously employed in any mm-wave, or EHF, radio.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A dual-mode power amplifier (PA) operative to amplify Radio Frequency (RF) signals having Extremely High Frequencies (EHF), comprising:
   a plurality of separately-enabled, differential PA units arranged in parallel, each PA unit comprises
      an input stage comprising a pair of transistors arranged in a common-gate configuration; and
      a plurality of serially-connected output stages, each comprising a pair of transistors arranged in a common-source configuration;
   a transformer-based coupling circuit combining the outputs of the PA units;
   wherein one or more PA units further comprises a switch operative to short the PA unit outputs at an interface to the transformer-based coupling circuit in a low power mode, and to allow the PA unit outputs to couple to the transformer-based coupling circuit in a high power mode.

2. The amplifier of claim 1, wherein the transistors in each successive state of each PA unit increase in size by a factor of two.

3. The amplifier of claim 1, wherein the output stages of each PA unit further comprise interdigitated metal-oxide-metal capacitors cross-connected between the drain and gate terminals of each pair of transistors.

4. The amplifier of claim 1, wherein the PA is biased to operate as a Class AB amplifier.

5. The amplifier of claim 1, wherein the dual-mode PA is implemented as a CMOS integrated circuit, and wherein the transformer-based coupling circuit is implemented in an overlay structure with top two metal layers.

6. The amplifier of claim 5, wherein the top two metal layers have a thickness of 0.9 μm.

7. The amplifier of claim 5, wherein the switch has an on resistance $R_{ON}$ of 10Ω.

8. The amplifier of claim 7, wherein the switch is fabricated as a thin-oxide transistor having gate length of 40 nm.

9. The amplifier of claim 7, wherein the switch transistor is biased at 0.5 V in an on state and 2 V in an off state.

10. A method of operating a dual-mode power amplifier (PA) operative to amplify Radio Frequency (RF) signals having Extremely High Frequencies (EHF), the PA comprising a plurality of separately-enabled, differential PA units arranged in parallel, wherein each PA unit comprises an input stage comprising a pair of transistors arranged in a common-gate configuration and a plurality of serially-connected output stages, each comprising a pair of transistors arranged in a common-source configuration and wherein a transformer-based coupling circuit combines the outputs of the PA units, the method comprising:
  in a high power mode, enabling two or more of the plurality of differential PA units by allowing the outputs of each PA unit to couple to the transformer-based coupling circuit; and
  in a low power mode, disabling at least one of the plurality of differential PA units by shorting the outputs of the disabled PA unit at an interface to the transformer-based coupling circuit.

11. The method of claim 10, wherein enabling two or more of the plurality of differential PA units in the high power mode comprises enabling all of the differential PA units.

12. The method of claim 10, wherein shorting the outputs of the disabled PA unit at the interface to the transformer-based coupling circuit comprises biasing a switch transistor connected between the outputs of PA units to a conductive mode.

* * * * *